United States Patent [19]

Lee et al.

[11] Patent Number: 4,692,839
[45] Date of Patent: Sep. 8, 1987

[54] MULTIPLE CHIP INTERCONNECTION SYSTEM AND PACKAGE

[75] Inventors: James C. K. Lee, Los Altos; Richard L. Beck, Cupertino; Francisca Tung, Los Gatos, all of Calif.

[73] Assignee: Digital Equipment Corporation, Maynard, Mass.

[21] Appl. No.: 748,087

[22] Filed: Jun. 24, 1985

[51] Int. Cl.$^4$ .................. H05K 7/20; H01L 23/12
[52] U.S. Cl. .................................. 361/386; 357/81
[58] Field of Search .................. 361/386, 387, 388; 357/80, 81

[56] References Cited

U.S. PATENT DOCUMENTS 4,544,989 10/1985 Nakabu et al. .................. 361/386 X
4,574,470 3/1986 Burt .................................. 357/81 X
4,577,398 3/1986 Sliwa .................................. 357/80 X

*Primary Examiner*—Louis K. Rimrodt
*Attorney, Agent, or Firm*—Cesari and McKenna

[57] ABSTRACT

A multiple chip interconnection system and package for interconnecting and cooling integrated circuits includes an electrically-conductive plate 10 having an upper surface 12. On the upper surface 12, a first layer of polyimide 16 or other electrically-insulating material is deposited. One or more layers of electrical interconnections 17, 18, 21, 22, and insulating material 19, 24, are then disposed on the insulating material 16 to provide a network of electrical connections embedded in insulating material, yet which is sufficiently thin to offer minimal thermal resistance to the transfer of heat from integrated circuits mounted thereon to the plate 10. After the layers of interconnections are completed, one or more conductive planes are deposited across the interconnections to serve as a mounting surface for the integrated circuits and to distribute power and ground signals as necessary. One or more integrated circuits 40 are then attached to the plane 32 and suitable interconnections made between the integrated circuits and desired regions 34 of the plane. The package is completed by attaching an air- or water-cooled heat sink 54 to the opposite side of plate 10 from the integrated circuits. The integrated circuits may be protected by a lid 50, 52, and pins attached to openings in the plate 10 to connect the module to a printed circuit board or other desired connector.

15 Claims, 14 Drawing Figures

MULTIPLE CHIP INTERCONNECTION SYSTEM AND PACKAGE

BACKGROUND OF THE INVENTION

1. Field of the Invention

This invention relates to the interconnection and packaging of integrated circuits, and particularly to a module for compactly interconnecting a number of integrated circuit die in a desired manner and maintaining them under temperature-controlled conditions. The invention also provides a module containing such die which may be adapted to be connected to a printed circuit board, socket or other such connector.

2. Description of the Prior Art

The interconnection and packaging of integrated circuit die, commonly termed "chips," in a digital computer is crucial to the cost and performance of the resulting machine. As improvements in fabrication technology permit integrated circuits to have increasing numbers of components and connections per unit area, the interconnection and cooling of such circuits becomes progressively more difficult. In addition, while the extremely small size of individual transistors and other integrated circuit components permits enhanced speed of operation of an individual chip, an increasingly significant source of delay in the overall speed of operation of computers incorporating those components is the delay inherent in the transfer of signals among separate integrated circuits. Thus, to minimize propagation delays as between chips, designers of today's digital computers attempt to situate the integrated circuits making up the overall system as close together as possible. Unfortunately, as the integrated circuits are spaced increasingly closer together, the problems of interconnecting and cooling the circuits become more and more severe.

Many different approaches have been proposed and employed to interconnect and package groups of integrated circuits in digital computers. For example, a survey of this technology appears in "Microelectronic Packaging" by A. J. Blodgett, Jr., *Scientific American*, July 1983, pp. 86–96.

Among other technologies, Blodgett describes the thermal conduction module used by IBM in its 3081 series systems. In that module, integrated circuits are bonded face-down to a ceramic substrate upon which a pattern of electrically-conductive material has been formed. The ceramic substrate includes a sandwich of many individual layers of ceramic material, each supporting a patterned layer of electrical conductors. The various layers of electrical conductors are separated from one another by the intervening ceramic. Vias formed through the ceramic material are used to interconnect desired portions of the electrically conductive material on one layer to desired portions of the electrically conductive material on another layer. The bottom layer of the substrate is coupled to pins which mate with corresponding openings in a printed circuit board or other connector. Heat is dissipated from the integrated circuits primarily by spring-loaded metal pistons, one of which bears against the exposed back side of each circuit. In turn, the pistons are cooled by water circulating through channels in a plate attached to the piston assembly.

Another article discussing the cooling and interconnection of integrated circuits in mainframe computers is "Cooling Modern Mainframes—A Liquid Approach," by E. A. Wilson, *Computer Design*, May 1983, pp. 219–225. That article describes another water cooling system for cooling packages in a mainframe computer.

Prior art approaches to interconnecting and packaging multiple integrated circuits, however, suffer from several disadvantages. First, the circuits are not as densely packaged as desirable because of inefficient heat transfer between the integrated circuit and the heat exchange medium, and because the pitch of the electrical connections on the substrate cannot be as small as desired. For example, in the 3081 series module described, the thermal coupling between the spring-loaded piston and the back side of the integrated circuit is inefficient. This inefficient contact does not permit as much heat to travel from the chip into the piston as desirable. Secondly, because the conductive pattern formed on the ceramic substrate consists of screen-printed, thick film lines. The density of the lines is very low. To meet higher density line requirements, additional layers of ceramic/interconnections must be employed, thereby increasing the cost of the module and the difficulty of fabricating it.

SUMMARY OF THE INVENTION

In a preferred embodiment this invention provides a module for interconnecting a desired number of integrated circuits in an exceptionally compact manner to minimize signal propagation delays, yet simultaneously provides efficient dissipation of heat generated during operation of the circuits. The module includes a thermally-conductive substrate, typically a copper or copper alloy plate on the order of the same thickness as the integrated circuits to be packaged. On the upper surface of the substrate, a very thin layer of electrically-insulating material is deposited, followed by a layer of electrical interconnections. In the preferred embodiment the electrical interconnections are defined photolithographically. As many subsequent layers of insulating material and electrical interconnections as necessary are then sequentially formed, and vias are formed to provide connections between the various layers. These multiple layers provide the desired interconnections, yet are sufficiently thin to allow efficient heat transfer through themselves. The fine tolerances available with photolithography enable a few layers of interconnections to be used for a large number of die.

One or more power supply and ground planes are formed, typically by plating atop the layers of electrical interconnections, again with vias providing conductive signal paths to desired regions in underlying layers. The integrated circuits are then attached to the uppermost power or ground plane, with the inactive surface juxtaposed the plane, and wire bonding or tape-automated bonding employed to provide electrical connections between the integrated circuit and the surrounding connections.

The module assembly is completed by fabricating openings around the perimeter of the substrate to receive pins for interconnecting the module assembly to a socket, printed circuit board or other connector. A heat sink may be attached to the opposite side of the substrate from the side to which the integrated circuits are attached, and, if desired, a lid may be provided to enclose the circuits.

Because the electrical interconnections are embedded in insulating material both beneath and between the die, signal paths are short, and propagation delays minimal.

The few microns of insulating material separating the module from the metal substrate permits high thermal conduction, without sacrificing electrical isolation. The relatively thin, yet highly thermally-conductive substrate, insures excellent thermal coupling between the integrated circuits and attached cooling apparatus attached to the substrate opposite the circuits. Because the inactive surfaces of the integrated circuits are attached to the substrate, wire bonding or tape-automated bonding may be employed to interconnect them to the uppermost layer of electrical connections.

BRIEF DESCRIPTION OF THE DRAWINGS

FIG. 1A is a cross section of the substrate after formation of a layer of insulating material and a first electrically-conductive layer;

FIG 1B is a cross section after patterning of the layer of interconnections and formation of an additional layer of insulating material;

FIG. 1C is a subsequent cross-sectional view after deposition of a second layer of electrically-conductive material;

FIG. 1D is a subsequent cross-sectional view after patterning the second layer of electrically-conductive material;

FIG. 1E is a subsequent cross-sectional view after deposition of further layers of insulating and electrically-conductive material;

DETAILED DESCRIPTION OF THE PREFERRED EMBODIMENTS

Figure 1:
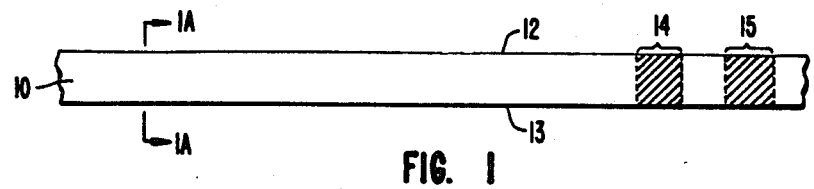
FIG. 1 is a cross-sectional view of an electrically-conductive substrate suitable for application to this invention.

The figures illustrate one method of fabricating a preferred embodiment of the multiple chip interconnection system of this invention. FIG. 1 is a cross-sectional view of the substrate 10 suitable for application to this invention. In the preferred embodiment, substrate 10 comprises a relatively thin plate having high thermal conductivity, and which is appropriately sized to support a number of integrated circuits. In one embodiment plate 10 consists of a high-conductivity, free-machining copper alloy such as copper alloy C14700. The plate 10 is 40 mils thick, rectangular, and several inches on a side, and may be purchased from Amax Copper, Inc. In most embodiments plate 10 also will be electrically conductive to enable it to carry power, ground or other signals. Surface 12 of plate 10 is made as flat as possible for reasons described below.

A desired number of openings 14 and 15 are formed through plate 10 to enable electrically-conductive pins to extend between the upper surface 12 of plate 10 and its lower surface 13 to couple the module to a circuit board, socket, or other connector. These openings are then plugged flush with the upper 12 and lower 13 surfaces using suitable material; for example, epoxy or liquid polyimide (available from DuPont). If polyimide is used, an adhesive layer may be employed between the copper and the polyimide.

Figure 1A:
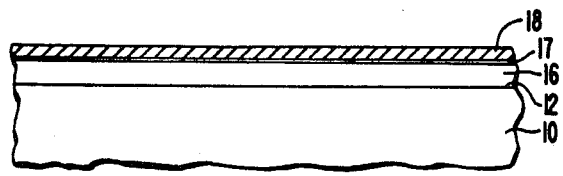
FIGS. 1A-1E illustrate one process by which a series of electrically-conductive layers of interconnections and insulating material may be fabricated on the substrate. In particular.

FIG. 1A is an enlarged view of a portion of plate 10. Following the steps described in conjunction with FIG. 1, a relatively thin layer of polyimide 16 or other suitable electrically-insulating material is deposited across the upper surface of the plate using conventional semiconductor fabrication technology. In the preferred embodiment, layer 16 is polyimide approximately 3 to 25 microns thick and will electrically isolate desired portions of subsequently formed overlaying conductive layers from plate 10. If plate 10 is to carry electrical signals or provide power or ground, openings through layer 16 may be photolithographically defined and the polyimide in the defined areas removed using well known semiconductor fabrication technology. If such openings are provided, any conductive layer deposited on the upper surface of polyimide 16 will be electrically connected through the openings to plate 10. This allows electrical power or ground signals supplied to be coupled to conductors formed over layer 16.

On the upper surface of layer 16, a very thin layer of titanium 17, on the order of a few hundred Angstroms, is deposited, for example, by sputtering or other well known techniques. Across the upper surface of the titanium layer 17, a thicker 18 layer of copper, on the order of 3 to 4 microns thick, is sputtered. The titanium assures proper adherence of the copper layer 18 to the polyimide 16. Of course, other well known materials may be employed; however, because of its excellent electrical conductivity, copper is preferred as layer 18.

Figure 1B:
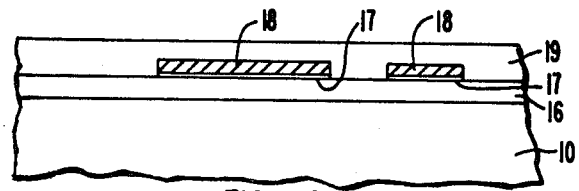

Using conventional photolithographic techniques, the sandwich of titanium 17 and copper 18 will be defined into desired regions of electrically-conductive material as depicted in FIG. 1B. One such well known photolithographic process is to spin photoresist across the upper surface of layer 18, expose the photoresist through a mask and develop it. The thereby exposed portions of the copper titanium sandwich then are etched either by standard chemical means or by plasma etching in an activated gas such as $CF_4$.

As next shown in FIG. 1B, an additional layer of insulating material 19 is deposited across the remaining portions of layers 17 and 18. In the preferred embodiment, 10 microns of polyimide (measured from underlying polyimide 16) are spread across the surface of the structure. Again, using well known semiconductor fabrication technology, the polyimide layer 19 is masked and removed wherever vias to the underlying conductive regions 17 and 18 are desired. One such via 20 is shown in the center of FIG. 1C where polyimide 19 has been removed.

Figure 1C:
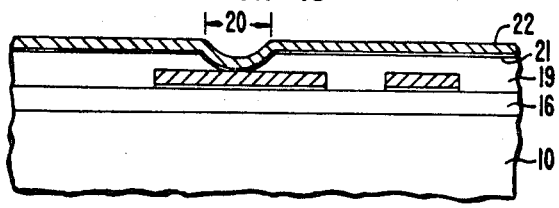

As also shown in FIG. 1C, further layers of titanium 21 and copper 22 are deposited across the upper surface of the polyimide 19. In those regions where polyimide layer 19 has been removed, titanium layer 21 and copper layer 22 will contact the underlying electrically-conductive regions, thereby forming a via. Titanium layer 21 is on the order of 200 Angstroms thick, while copper layer 22 is approximately 5 microns thick.

Figure 1D:
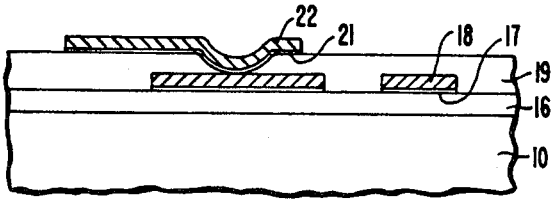

Again, using well known masking and etching processes, layers 21 and 22 are patterned into a desired configuration. This is illustrated in FIG. 1D.

Figure 1E:
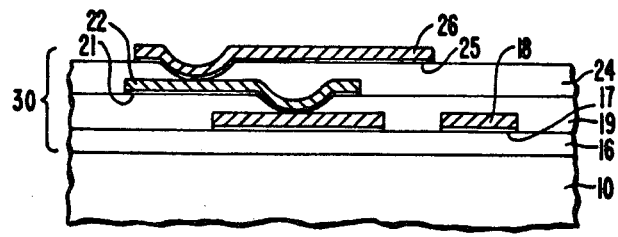

The process described in conjunction with FIGS. 1A-1D may be repeated as many times as desired to form additional layers of insulating material and conductive material, as well as further vias. FIG. 1E depicts such a structure in which a third layer of polyimide 24 has been deposited, as well as a third sandwich of electrically-conductive titanium 25 and copper 26 deposited and defined. Once as many layers of insulating and conductive material as desired are formed, the process described in conjunction with FIGS. 2-8 may be employed. In the preferred embodiment four metal layers (power, ground, X and Y) are employed, with five polyimide layers. The metal layers are typically 5 microns thick, with the polyimide being 3-10 microns thick.

Figure 2:
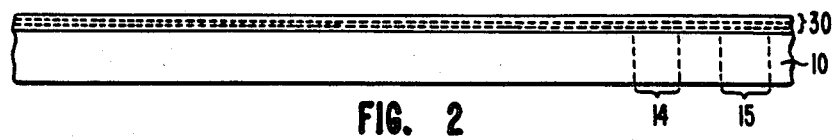
FIG. 2 is a cross-sectional view illustrating the appearance of the substrate after completion of the process described in conjunction with FIGS. 1A-1E.

FIG. 2 is a cross section of the plate 10 together with the upper sandwich of insulating and conductive layers 30 illustrating their appearance at the completion of the process of FIGS. 1A-1E. The vertical scale of FIG. 2, as well as subsequent figures, is greatly exaggerated.

Figure 3:
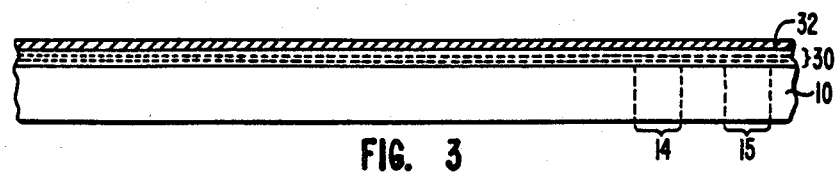
FIG. 3 is a subsequent cross-sectional view after formation of the first conductive plane on the structure of FIG. 2.

On the upper surface of the structure, an electrically-conductive layer 32 is formed, as shown in FIG. 3. In the preferred embodiment, layer 32 comprises copper sputtered to a thickness of 3 to 5 microns and plated with a few hundred Angstroms of a barrier metal such as of nickel, followed by 0.6 microns of gold. The copper provides high electrical and thermal conductivity, and the nickel insures adequate adherence between the copper and the gold layers and reduces the interdiffusion of copper and gold. The gold layer allows solder attachment of integrated circuits in the manner described below. Conductive plane 32 will provide ground or power signal distribution in some embodiments of the invention. If desired, for example, in systems where multiple reference voltage sources are necessary, additional insulating material may be deposited on the upper surface of sandwich 32 and additional conductive layers formed thereon to provide additional power and/or ground distribution for the package. In such instances only the upper conductive plane will include the gold-nickel plating.

Figure 4:
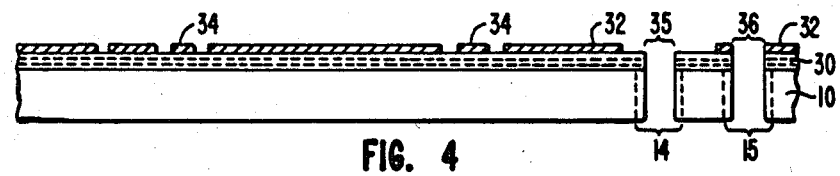
FIG. 4 is a subsequent cross-sectional view after removal of undesired portions of the electrically-conductive plane and formation of openings through the substrate.

As shown by FIG. 4, using conventional masking and etching techniques, portions of plane 32 may be removed as desired from the surface of underlying material 30. In the preferred embodiment these regions are defined photolithographically and the portions removed chemically. For example, at this stage of the process, bonding pads will be defined in plane 32 where electrically-conductive leads from integrated circuits may be attached using wire bonding, tape-automated bonding, or other well known techniques. In FIG. 4 the bonding pads 34 are shown in cross section. Generally bonding pads 34 will be contacted on their lower surface by the uppermost layer of electrically-conductive material 26 as deposited in conjunction with FIGS. 1A-1E. This enables signals from the integrated circuits to travel from one circuit to another through the layers described in conjunction with FIGS. 1A-1E.

The former openings 14 and 15 are then reopened, for example, by redrilling them. In the preferred embodiment an annular region of insulating material epoxy will remain about the periphery of each opening to provide an insulation layer. With this insulation layer, a pin inserted into the openings will not be shorted to substrate 10.

Figure 5:
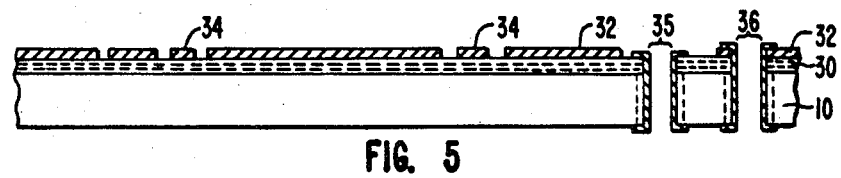
FIG. 5 is a subsequent cross-sectional view after plating the interior surfaces of the openings to electrically connect them to desired regions on the substrate.

As next shown in FIG. 5, and also using well known techniques, the openings 35 and 36 are plated with conductive material 38, for example, copper, to make their interior surfaces electrically conductive and to connect them to electrically-conductive conductive plane(s) 32. The plated lining of the openings will be connected to the plane(s) 32 wherever such planes are permitted to extend to the edge of openings 35 and 36. For example, a portion of plane 32 has been allowed to encircle opening 36. Thus, the plating 38 will be electrically connected to a portion of plane 32. In this manner pins inserted and attached in openings 35 and 36 will be electrically connected to desired portions of circuits in the assembly.

Figure 6:
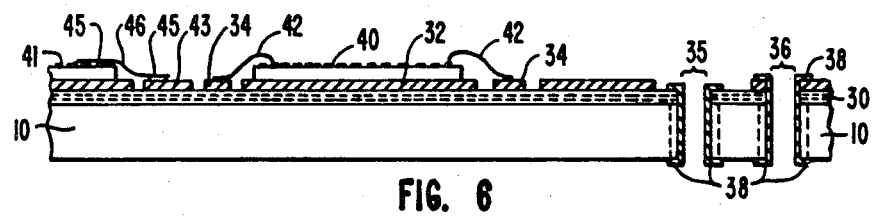
FIG. 6 is a subsequent cross-sectional view after attaching an integrated circuit and electrically connecting it to the underlying structure.

The integrated circuit die 40 are then attached to the upper surface of the uppermost conductive plane 32 in the manner shown in FIG. 6. In the preferred embodiment, if the die substrate is electrically biased no insulation is placed between the back of the integrated circuit 40 and the conductive plane. In this embodiment the die 40 is soldered to the conductive plane by placing a solder preform beneath each die to be attached and heating the entire assembly to melt the solder and affix the die to the plane 32. In the event it is desired to electrically isolate the substrate of the integrated circuit 40 from plane 32, the back side of the die may be attached to plane 32 using insulating material such as epoxy.

As also shown in FIG. 6, the individual circuits within integrated circuit die 40 may be electrically connected to bonding pads 34 using well known wire bonding 42. The wire bonds 42 electrically connect the integrated circuit 40 through the conductive bonding pads 34 to the interconnections disposed in layer 30, and to the plating 38 in desired ones of openings 35 and 36.

In an alternate embodiment of the invention illustrated on the left-hand side of FIG. 6, an integrated circuit die 41 is shown electrically connected to a region 43 in plane 32 using tape-automated bonding. In such an embodiment well known bumps 45 are plated onto plane 32 as well as the bonding pads of die 41 to enable copper foil or other well known material to provide electrical interconnections. Tape-automated bonds such as lead 46 enable all of the electrical connections between a die 41 and the surrounding bonding pads to be formed in a single operation, in contrast to wire bonding in which the wires are connected one at a time.

The tape-automated bond 46 illustrated in FIG. 6 is provided only for the purpose of illustration. Although tape-automated bonds and wire bonds may be fabricated in the same module, typically only one type of bonding will be used in a single module.

Figure 7:
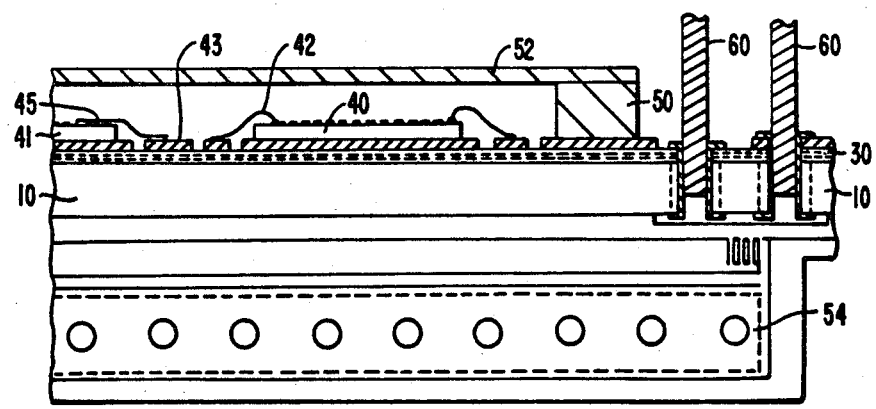
FIG. 7 is a subsequent cross-sectional view after attaching pins in the openings in the substrate, providing a heat sink on the lower surface of the substrate, and providing a lid to cover the integrated circuits.

Following the formation of electrical connections 42 and/or 46 between the dice 40 and 41 and the plane 32, the package assembly will be completed in the manner depicted in FIG. 7.

A lid 52 may be attached to the upper surface of the signal plane 32 using a spacer 50. In one embodiment lid 52 and spacer 50 are ceramic and are pre-attached to each other by known glass frit seals. The lid assembly is then attached to the substrate by a low-temperature process such as epoxy bonding or soldering. Also in the preferred embodiment, a cooling chamber 54 is attached to the lower surface of plate 10. Cooling chamber 54 will provide a heat sink for heat generated by the operation of the numerous integrated circuits which may be attached to the opposite surface of plate 10. Cooling may be accomplished in lower power applications, for example, those utilizing CMOS die 40, using only radiative or forced air cooling. In higher power applications, for example, when the integrated circuits are bipolar devices, water cooling may be used. In such embodiments cooling chamber 54 may comprise a chamber through which water is pumped to dissipate heat from plate 10. One embodiment of such a cooling chamber is shown in commonly assigned U.S. Pat. application Ser. No. 590,651, entitled "Module Construction for Semiconductor Chip" and filed Mar. 19, 1984, now U.S. Pat. No. 4,603,345, issued July 29, 1986.

To enable electrical connection of the integrated circuits mounted on plane 32 to exterior apparatus, pins 60 may be soldered or otherwise attached within openings 35 and 36. In this manner the entire module assembly depicted in FIG. 7 and 8 may be inserted into a socket, printed circuit board, or other connecting apparatus. In one embodiment of the invention 21 integrated circuits are connected through 860 pins to such apparatus.

Figure 8:
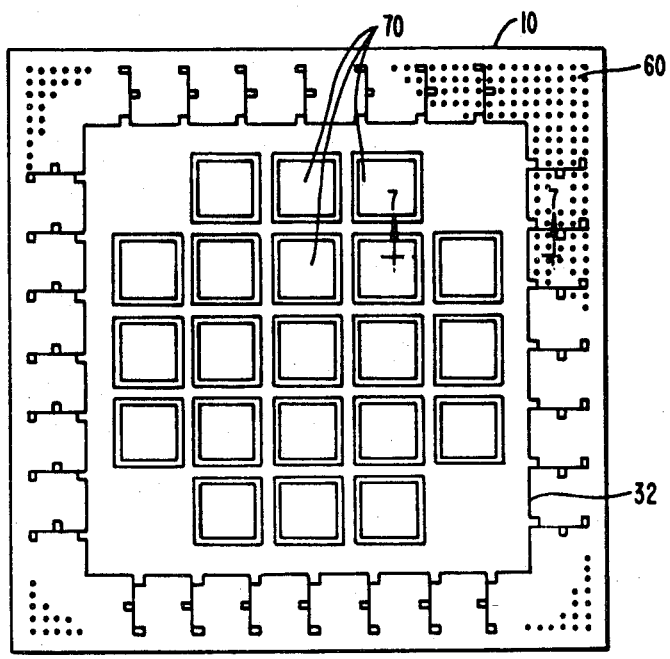
FIG. 8 is a top view of the overall module, with cover removed, including the structure shown in FIG. 7.

FIG. 8 is a top view of the overall module assembly depicted in cross-section in FIG. 7 and illustrates how a desired number of integrated circuit die may be interconnected. The electrically-conductive substrate 10 is illustrated as a square plate in FIG. 8. However, other desired shapes may be used. The structure shown in FIG. 8 includes provision for 21 separate integrated circuits to be attached to plane 32. Disposed about the perimeter of plane 32 are five rows of pins 60 extending around the array of integrated circuits.

Figure 9:
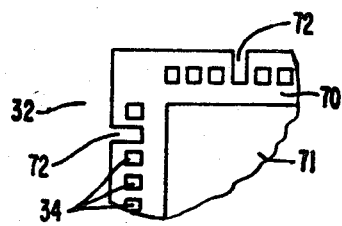
FIG. 9 is an expanded view of the bonding pads shown in FIG. 8.

FIG. 9 is an expanded view of the bonding pads 34. An annular region 70 separates the portion 71 of plane 32 to which the individual integrated circuit die are attached from the bonding pads 34. Tabs 72 connect desired ones of the bonding pads 34 to the surrounding plane 32 to electrically connect any lead bonded to such a pad 34 to the exterior plane to enable connection of the desired power supply or reference voltage to that pad through tab 72.

The package depicted in the figures provides several unique features in comparison to the packages and interconnection schemes of the prior art. In particular, the package provides interconnections for a large number of integrated circuits in an exceptionally compact manner to minimize signal propagation delays. At the same time the package provides highly efficient dissipation of heat generated during operation of the circuits in view of the excellent thermal coupling of the back of each integrated circuit die 40 with the thermally-conductive plate 10. The intervening material 30 is sufficiently thin so as to offer minimal resistance to the dissipation of heat. The package allows as many interconnections within interconnect layers 30 as desired, while permitting the interconnections to be formed directly beneath the locations to which the die are attached. The package allows as many voltage and signal planes as desired to be formed beneath the die to provide power and ground signal distribution, while being compatible with different types of heat sinks without redesign of the overall system.

The preceding description of the preferred embodiments of the invention are intended to illustrate the invention, and for that reason numerous details of these embodiments have been described. These details are not intended to limit the invention which may be ascertained from the following claims.

We claim:

1. A module for interconnecting integrated circuits comprising:
    a thermally-conductive substrate having a first surface;
    a first layer of electrically-insulating material disposed across the first surface;
    at least one layer of electrical interconnections disposed on the layer of electrically-insulating material;
    a second layer of electrically-insulating material disposed across the at least one layer of electrical interconnections and including openings therethrough to selected portions of the at least one layer of electrical interconnections;
    an upper layer of electrical interconnections disposed over the second layer electrically-insulating material and extending through the openings to contact selected portions of the at least one layer;
    a plurality of integrated circuits attached to the upper layer; and
    means for electrically connecting the integrated circuits to the upper layer.

2. A module as in claim 1 wherein the substrate includes a second surface and a heat sink is attached to the second surface.

3. A module as in claim 2 wherein the substrate is a plate of desired thickness with the first surface being one side and the second surface being the opposite side.

4. A module as in claim 3 wherein the substrate includes a plurality of openings therethrough into which pins are inserted to adapt the module to be connected to other apparatus.

5. A module as in claim 4 wherein the openings are insulated from the remainder of the substrate by annular regions of insulating material.

6. A module as in claim 5 wherein each opening includes an interior surface coated by electrically-conductive material.

7. A module as in claim 6 wherein the upper layer of electrical interconnections is adapted to encircle desired ones of the openings and the coating on the interior of such openings extends to electrically contact the upper layer.

8. A module as in claim 7 further comprising a lid attached to the upper layer to cover the integrated circuits.

9. A module as in claim 1 wherein the electrically-conductive substrate comprises an alloy of copper.

10. A module as in claim 9 wherein the first layer of electrically-insulating material comprises polyimide.

11. A module as in claim 10 wherein the at least one layer of electrical interconnections comprises a sandwich of a lower layer of titanium and an upper layer of copper.

12. A module as in claim 11 wherein the second layer of electrically-insulating material comprises polyimide.

13. A module as in claim 1 wherein the means for electrically connecting the integrated circuits to the upper layer comprises wire bonding.

14. A module as in claim 1 wherein the means for electrically connecting the integrated circuits to the upper layer comprises tape-automated bonding.

15. A module for interconnecting integrated circuits comprising:
- a thermally conductive plate;
- a first layer of electrically-insulating material disposed on the plate;
- a first layer of electrical connections;
- a second layer of insulating material disposed over selected portions of the first layer of electrical connections;
- a second layer of electrical connections disposed over the second layer of insulating material and in contact with selected portions of the first
- a third layer of insulating material disposed over selected portions of the second layer of electrical connections;
- a layer of electrically-conductive material disposed over the third layer of insulating material and in contact with the non-selected portions of the second layer of electrical connections;
- a plurality of integrated circuits attached to the layer of electrically-conductive material; and
- means for electrically-connecting integrated circuits to the layer of electrically-conductive material disposed over the third layer.

* * * * *